United States Patent [19]
Alexander

[11] Patent Number: 4,514,441
[45] Date of Patent: Apr. 30, 1985

[54] DIELECTRIC MATERIALS

[75] Inventor: John H. Alexander, Bishop's Stortford, England

[73] Assignee: International Standard Electric Corporation, New York, N.Y.

[21] Appl. No.: 547,197

[22] Filed: Oct. 31, 1983

[30] Foreign Application Priority Data

Nov. 17, 1982 [GB] United Kingdom ............... 8232779

[51] Int. Cl.³ ............................................. B05D 5/12
[52] U.S. Cl. ................................. 427/126.6; 427/79;
427/81; 427/126.3; 427/255.3
[58] Field of Search ............ 427/79, 81, 126.3, 126.6, 427/255.3; 428/697

[56] References Cited

U.S. PATENT DOCUMENTS 4,199,383  4/1980  Wittry .............................. 427/255.3
4,260,663  4/1981  Hagemann et al. .................. 427/81
4,316,785  2/1982  Suzuki et al. ........................ 427/63

*Primary Examiner*—Richard Bueker
*Attorney, Agent, or Firm*—John T. O'Halloran; Peter R. Ruzek; Mary C. Werner

[57] ABSTRACT

A method of manufacturing thin film dielectric material by directing vapors of reactants containing lead and additional metals and an oxidizing gas onto a heated substrate to form a layer of dielectric material thereon, which layer can be of a high dielectric constant (greater than 5000).

6 Claims, 1 Drawing Figure

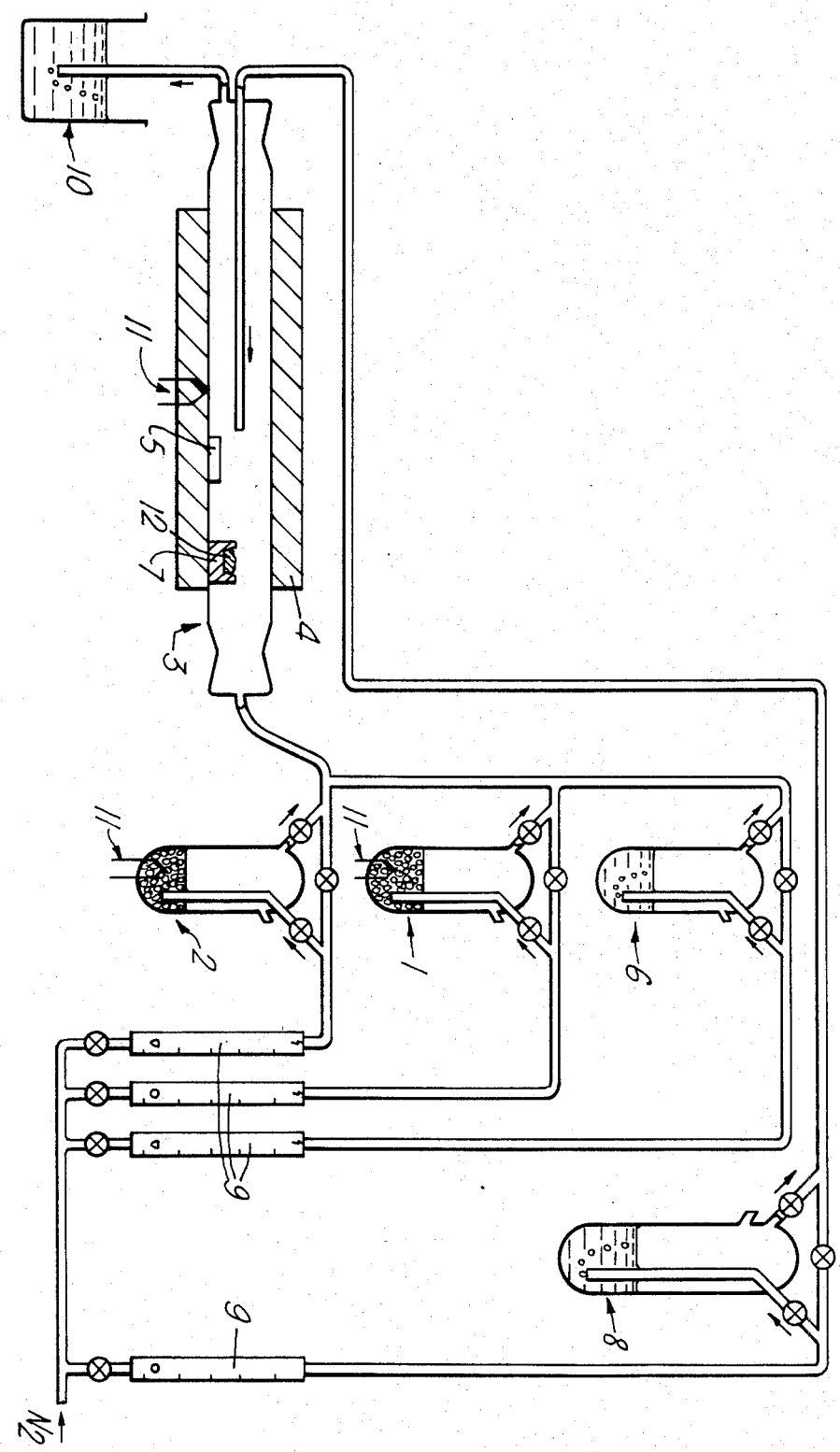

DIELECTRIC MATERIALS

BACKGROUND OF THE INVENTION

This invention relates to dielectric materials and in particular, but not exclusively, high dielectric constant dielectric materials for capacitors and other devices such as sensors.

Dielectric materials are used in various electrical components for various purposes. In the case of capacitors dielectric materials may be employed as the dielectric between metallic electrodes, or in the case of sensors, dielectric materials may be employed to provide substrates on which sensing films are arranged. Conventionally the dielectric materials may be powders which are mixed with binder and solvents, formed to a required shape and then sintered in order to reduce porosity.

The dielectric material most commonly employed is barium titanate which has a dielectric constant of the order of 1500. Very much higher dielectric constant values are, however, provided by bulk dielectric materials such as $PbFe_{2/3}W_{1/3}O_3$, $PbFe_{1/2}Nb_{1/2}O_3$ and $PbZn_{1/3}Nb_{2/3}O_3$. With suitable choice of materials it has already been demonstrated that multilayer ceramic capacitors can be produced in which the ceramic dielectric constant is 20,000 or more. These known multilayer ceramic capacitors were, however, manufactured using the conventional process of mixing powders with binders and solvents and forming them to a required shape, by, for example, pressing. After screen printing of electrodes thereon and the assembly of stacks of electrode-carrying ceramic bodies, the stacks must be fired in order to sinter the ceramic to reduce porosity.

SUMMARY OF THE INVENTION

It is an object of the present invention to provide a method of manufacturing a layer of dielectric material of the formula $Pb(X,Y)O_3$ in a simple, inexpensive and reliable manner such that the layer has good electrical properties.

According to one aspect of the present invention there is provided a high dielectric constant dielectric material of the general formula $Pb(X,Y)O_3$ produced in thin film form by chemical vapour deposition.

According to another aspect of the present invention there is provided a method of manufacturing thin films of high dielectric constant materials of the general formula $Pb(X,Y)O_3$ by chemical vapour deposition, comprising directing vapours of the constituent elements onto a heated substrate together with an oxidising gas.

In this specification, high dielectric constant values are to be understood to mean values generally greater than 5,000.

BRIEF DESCRIPTION OF DRAWING

The sole FIGURE shows a schematic arrangement of an apparatus for producing thin fim dielectrics.

DESCRIPTION OF THE PREFERRED EMBODIMENT

The present invention is based on the recognition that such high dielectric constant materials with the general formula $Pb(X,Y)O_3$, where X and Y include Mg, Zn, Fe, Ni, Co, Nb, Ta, W, Sn, Ti and Zr, lend themselves particularly well to preparation by chemical vapour deposition so that very thin films thereof can be readily prepared, with an attendant reduction in size of capacitor elements, for example. This is because all of ceramic material constituents have volatile compounds, for example $Pb(C_2H_5)_4$, $NbCl_5$, $WF_6$, zinc acetylacetonate, which can be easily vaporised and oxidised in suitable reactors.

Hence the present invention provides a method of manufacturing thin films by directing vapours of reactants containing lead and at least two additional metals and an oxidising gas onto a heated substrate, the films having a dielectric constant generally greater than 5,000.

Thus the preparation of single high dielectric constant dielectric materials or a mixture of several high dielectric constant dielectric materials may be achieved at a heated surface by directing on to it suitable vapours of the elements required together with an oxidising gas such as oxygen, water vapour etc.

In this way a range of materials can be prepared in thin film form for use in capacitor or sensor elements, for example. Whilst the general formula of the dielectric materials quoted above was $Pb(X,Y)O_3$, the materials may contain PbO and two or more oxides of the elements Mg, Zn, Fe, Ni, Co, Nb, Ta, W, Sn, Ti, Zr, for example. The thickness of the films may be of the order of one micron, for example in the range 0.03 micron to several microns.

The apparatus illustrated somewhat schematically in the accompanying drawing has been employed to produce oxide films on suitable substrates by the hydrolysis of vapours of $PbBr_2$, $FeCl_3$ and $NbCl_5$ at temperatures in the range 500° to 800° C.

The $FeCl_3$ and $NbCl_5$, both in solid form, were contained in vessels 1 and 2 and heated (by means not shown) to create vapours to be transported by a flow of nitrogen to a reaction vessel 3 disposed in a furnace 4 and containing a substratre 5 on which an oxide film was to be formed. The temperatures used were 180° to 290° C. for $FeCl_3$ and 150° to 240° C. for $NbCl_5$. The $PbBr_2$ was prepared in situ by passing bromine vapour entrained in nitrogen from a vessel 6 containing liquid bromine, kept at room temperature, and over molten lead 12 contained in a graphite boat 7 in the vessel 3. The vessel 3 was heated to various temperatures in the range 500° to 800° C. during different experimental runs. Water vapour (oxidising gas) in the vessel 3 was produced by passing nitrogen through water in a vessel 8 which was kept at room temperature.

By selecting suitable nitrogen flow rates, oxide films 1 to 5 micrometer thick on substrate areas of approximately one square cm have been achieved in 20 to 100 minutes, with dielectric constant values varying from 160 to 128000. Typical nitrogen flow rates through the reagent vessels were 150 to 325 ml/min for the $FeCl_3$ in vessel 1, 80 to 250 ml/min for the $NbCl_5$ in vessel 2, 0 to 30 ml/min for the bromine in vessel 6 and 600 to 1200 ml/min for the water in vessel 8. In the case of 0 ml/min nitrogen flow through vessel 6, the stop cocks of vessel 6 were open and significant diffusion of bromine into the gas stream occurred. The nitrogen flow rates were indicated on flow meter tubes 9. The effluent gas from vessel 3 was bubbled through water in vessel 10. The connecting tubes between vessels 1, 2 and 3, and vessel 3 where it extends out of furnace 4 were heated in order to prevent condensation of the vapours on the walls thereof. The heating was achieved by means of electrical heating tape (not shown) wrapped around the tubes and the end of vessel 3 and also vessels 1 and 2, in order to provide the heating thereof. The vessels 1 and 2 and the furnace 4 each had a respective thermocouple 11 and temperature regulation means (not shown).

I claim:

1. A method of manufacturing thin film dielectric material comprising the steps of:

directing vapors of reactants containing lead and at least two additional metals including Fe and Nb and an oxidizing gas onto a substrate having a temperature at which oxides result from the reaction of the reactants with the oxidizing gas in a solid form on the substrate to form a thin film dielectric material layer thereon.

2. The method of claim 1 wherein said directing step includes so selecting the reactants that the dielectric constant of the layer has a value greater than 5000.

3. The method of claim 1 wherein the additional metals further include metals selected from the group consisting of Mg, Zn, Ni, Co, Ta, W, Sn, Ti and Zr.

4. A method of manufacturing a thin film dielectric material comprising the step of:

forming a dielectric layer on a substrate including directing vapors of reactants containing lead and at least two additional metals and an oxidizing gas onto the substrate which is brought to a temperature at which oxides result from the reaction of the reactants with the oxidizing gas in a solid form on the substrate.

5. The method of claim 4 wherein the metals are selected from the group consisting of Mg, Zn, Fe, Ni, Co, Nb, Ta, W, Sn, Ti and Zr.

6. The method of claim 4 wherein at least one of the metals is selected from the group consisting of Fe and Nb.

* * * * *